(12) United States Patent
Katsuki (10) Patent No.: US 12,512,378 B2
(45) Date of Patent: Dec. 30, 2025

(54) SEMICONDUCTOR MODULE AND SEMICONDUCTOR MODULE MANUFACTURING METHOD (71) Applicant: FUJI ELECTRIC CO., LTD., Kawasaki (JP)

(72) Inventor: Takashi Katsuki, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 984 days.

(21) Appl. No.: 17/463,131

(22) Filed: Aug. 31, 2021

(65) Prior Publication Data

US 2022/0077017 A1 Mar. 10, 2022

(30) Foreign Application Priority Data

Sep. 7, 2020 (JP) .................. 2020-149647

(51) Int. Cl.
*H01L 23/31* (2006.01)
*H01L 21/56* (2006.01)
(Continued)

(52) U.S. Cl.
CPC ........ *H01L 23/3142* (2013.01); *H01L 21/561* (2013.01); *H01L 23/296* (2013.01);
(Continued)

(58) Field of Classification Search
CPC . H01L 23/3142; H01L 21/561; H01L 21/563; H01L 23/296; H01L 23/3107; H01L 23/3121; H01L 24/48; H01L 29/1602; H01L 29/1608; H01L 29/2003; H01L 2224/48245; H01L 2224/48091; H01L 2224/73265; H01L 2924/183; H01L 2924/13055; H01L 23/02; H01L 23/04; H01L 23/045; H01L 23/053; H01L 23/10; H01L 13/12; H01L 13/13; H01L 23/14;
(Continued)

(56) References Cited

U.S. PATENT DOCUMENTS

2009/0160063 A1* 6/2009 Okumura ............ H01L 23/3114
257/784
2013/0240909 A1 9/2013 Hiramatsu et al.
(Continued)

FOREIGN PATENT DOCUMENTS

JP S61-36933 A 2/1986
JP H07-302863 A 11/1995
(Continued)

OTHER PUBLICATIONS

Office Action of Japanese Patent Application No. 2020-149647, mailed on Jan. 5, 2021. (English translation provided).

*Primary Examiner* — Julio J Maldonado
*Assistant Examiner* — Stanetta D Isaac
(74) *Attorney, Agent, or Firm* — Rabin & Berdo, P.C.

(57) ABSTRACT

A semiconductor module includes a semiconductor element made of a wide-bandgap semiconductor, the semiconductor element having an upper surface with an edge, a buffer member that covers the edge of the upper surface of the semiconductor element, and a sealing resin that seals the semiconductor element and the buffer member. The buffer member has a thickness equal to or larger than 50 μm.

17 Claims, 8 Drawing Sheets

(51) Int. Cl.
  *H01L 23/00* (2006.01)
  *H01L 23/29* (2006.01)
  *H10D 62/83* (2025.01)
  *H10D 62/832* (2025.01)
  *H10D 62/85* (2025.01)
(52) U.S. Cl.
  CPC ......... *H01L 24/48* (2013.01); *H10D 62/8303* (2025.01); *H10D 62/8325* (2025.01); *H10D 62/8503* (2025.01); *H01L 2224/48245* (2013.01); *H01L 2924/183* (2013.01); *H01L 2924/186* (2013.01); *H01L 2924/35121* (2013.01)
(58) Field of Classification Search
  CPC ......... H01L 23/28; H01L 24/29; H01L 24/73; H01L 24/92; H01L 24/32; H01L 24/85; H01L 24/83; H01L 2924/186; H01L 2924/35121; H01L 2924/00014; H01L 2924/181; H01L 2224/29101; H01L 2224/32225; H01L 2224/45014; H01L 2224/83801; H01L 2224/8384; H01L 2224/83951; H01L 2224/48472; H01L 2224/8592; H01L 2224/92247; H01L 23/24; H01L 23/3135; H01L 23/562; H10D 62/8303; H10D 62/8325; H10D 62/8503

USPC ........... 257/77, 86, 181, 676, 684, 737, 784, 257/27.137, 33.072
  See application file for complete search history.

(56) References Cited

U.S. PATENT DOCUMENTS

| | | |
|---|---|---|
| 2015/0171026 A1 | 6/2015 | Terai et al. |
| 2017/0352648 A1 | 12/2017 | Yasui et al. |
| 2019/0035770 A1* | 1/2019 | Iguchi ................. H01L 23/3121 |
| 2021/0366796 A1* | 11/2021 | Higashi ................... H01L 23/04 |

FOREIGN PATENT DOCUMENTS

| | | |
|---|---|---|
| JP | 2000-277666 A | 10/2000 |
| JP | 2006-351737 A | 12/2006 |
| JP | 2012-212703 A | 11/2012 |
| JP | 2013-016684 A | 1/2013 |
| JP | 2013-191716 A | 9/2013 |
| JP | 5638623 B2 | 12/2014 |
| JP | 2017-120840 A | 7/2017 |
| JP | 2017-143185 A | 8/2017 |
| JP | 2018-142746 A | 9/2018 |
| WO | 2014/009996 A1 | 1/2014 |
| WO | 2016/103434 A1 | 6/2016 |

\* cited by examiner

SEMICONDUCTOR MODULE AND SEMICONDUCTOR MODULE MANUFACTURING METHOD

CROSS REFERENCE TO RELATED APPLICATIONS

This application is based upon and claims the benefit of priority of the prior Japanese Patent Application No. 2020-149647, filed on Sep. 7, 2020, the entire contents of which are incorporated herein by reference.

BACKGROUND OF THE INVENTION

Field of the Invention

The present invention relates to a semiconductor module and a semiconductor module manufacturing method.

Description of the Related Art

Some semiconductor apparatuses have a substrate having thereon semiconductor elements such as an insulated gate bipolar transistor (IGBT), a power metal oxide semiconductor field effect transistor (MOSFET) and a free wheeling diode (FWD) and is utilized in, for example, an inverter apparatus.

International Publication No. WO 2014/009996 discloses a semiconductor module including a semiconductor element produced by using silicon carbide (SiC). In this type of semiconductor module, the semiconductor element is sealed with a thermosetting resin in order to protect the semiconductor element.

Due to heat generated while the semiconductor element is operating, thermal stress occurs between the semiconductor element and the sealing resin. For example, as the difference in coefficient of thermal expansion between the semiconductor element and the sealing resin increases, the occurring thermal stress increases. The thermal stress is normally concentrated at edge parts of an outer circumference of an upper surface and an upper part of a side surface of the semiconductor element.

By the way, in the case of using a harder material such as SiC, which is to be a next-generation device, a problem may arise in that cracking and peeling at a sealing resin interface occur from an edge part due to the thermal stress as described above.

An object of the present invention, which has been made in view of such a situation, to provide a semiconductor module having a configuration suitable for suppressing stress concentration near an edge part of an outer circumference of an upper surface of a wide-bandgap semiconductor element and a manufacturing method for such a semiconductor module.

SUMMARY OF THE INVENTION

A semiconductor module according to one form of the present invention includes a semiconductor element formed from a wide-bandgap semiconductor, a buffer member that covers an edge part of an outer circumference of an upper surface of the semiconductor element, and a sealing resin that covers the semiconductor element and the buffer member. The buffer member has a thickness equal to or larger than 50 µm.

A semiconductor module manufacturing method according to one aspect of the present invention includes a buffer member disposing step of disposing a buffer member at least at an edge part of an outer circumference of an upper surface of a semiconductor element formed from a wide-bandgap semiconductor, an opening part forming step of forming an opening part from which an upper surface electrode of the semiconductor element is exposed in an upper surface of the buffer member, and a wiring step of connecting a wiring member to the upper surface electrode. The buffer member has a thickness equal to or larger than 50 µm.

A semiconductor module manufacturing method according to one aspect of the present invention includes a wiring step of connecting a wiring member to an upper surface electrode of a semiconductor element formed from a wide-bandgap semiconductor, and a buffer member disposing step of disposing a buffer member at least at an edge part of an outer circumference of an upper surface of the semiconductor element after the wiring step. The buffer member has a thickness equal to or larger than 50 µm.

A semiconductor module manufacturing method according to one aspect of the present invention includes a buffer member disposing step of disposing a buffer member covering an edge part of an outer circumference of an upper surface of a semiconductor element formed from a wide-bandgap semiconductor and having an opening part from which an upper surface electrode of the semiconductor element is exposed, and a wiring step of connecting a wiring member to the upper surface electrode. The buffer member has a thickness equal to or larger than 50 µm.

Advantageous Effect of Invention

According to one form of the present invention, stress concentration near an edge part of an outer circumference of an upper surface of a wide-bandgap semiconductor chip can be suppressed in a semiconductor module.

DETAILED DESCRIPTION OF THE PREFERRED EMBODIMENT

Figure 1:
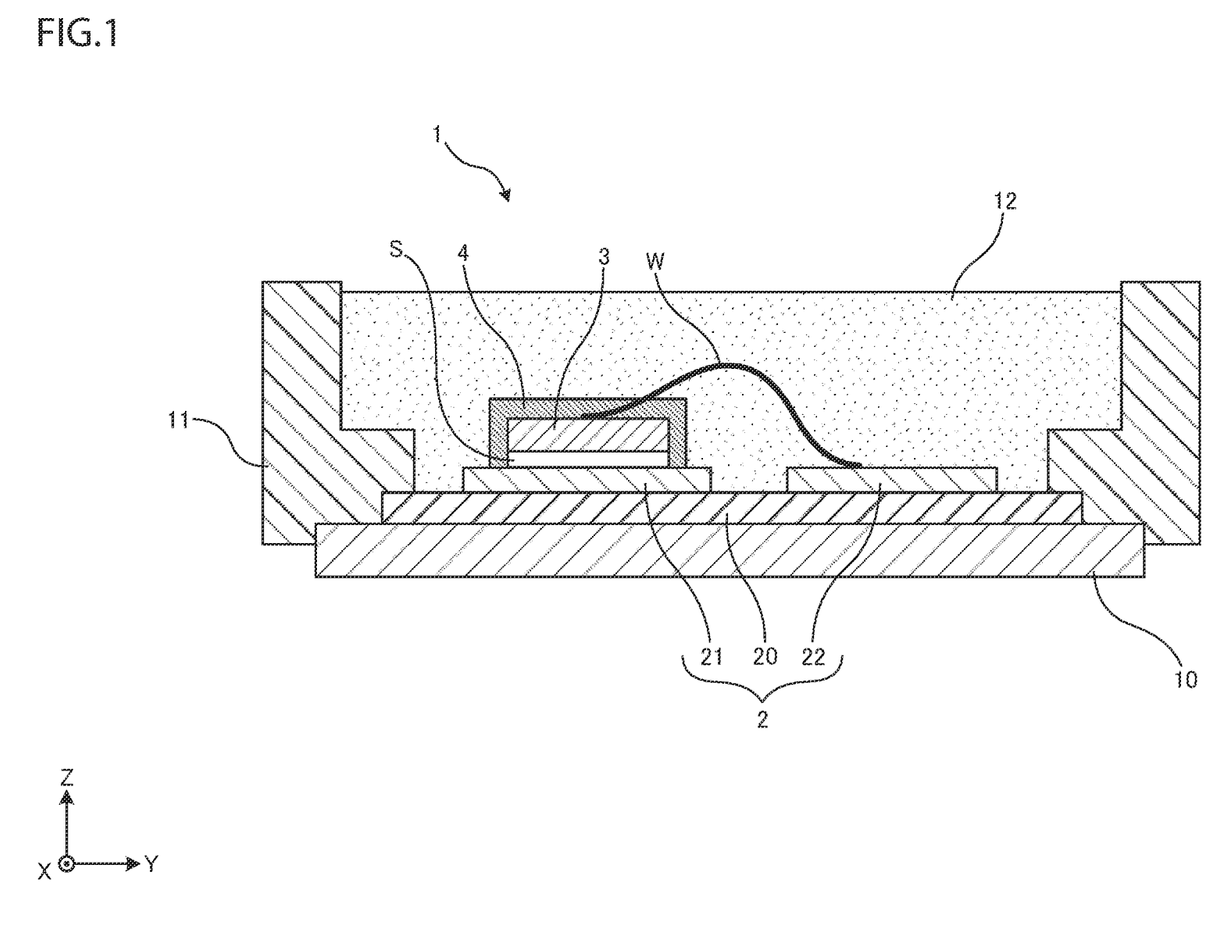
FIG. 1 is a cross-section view showing a semiconductor module according to an embodiment.
Figure 2:
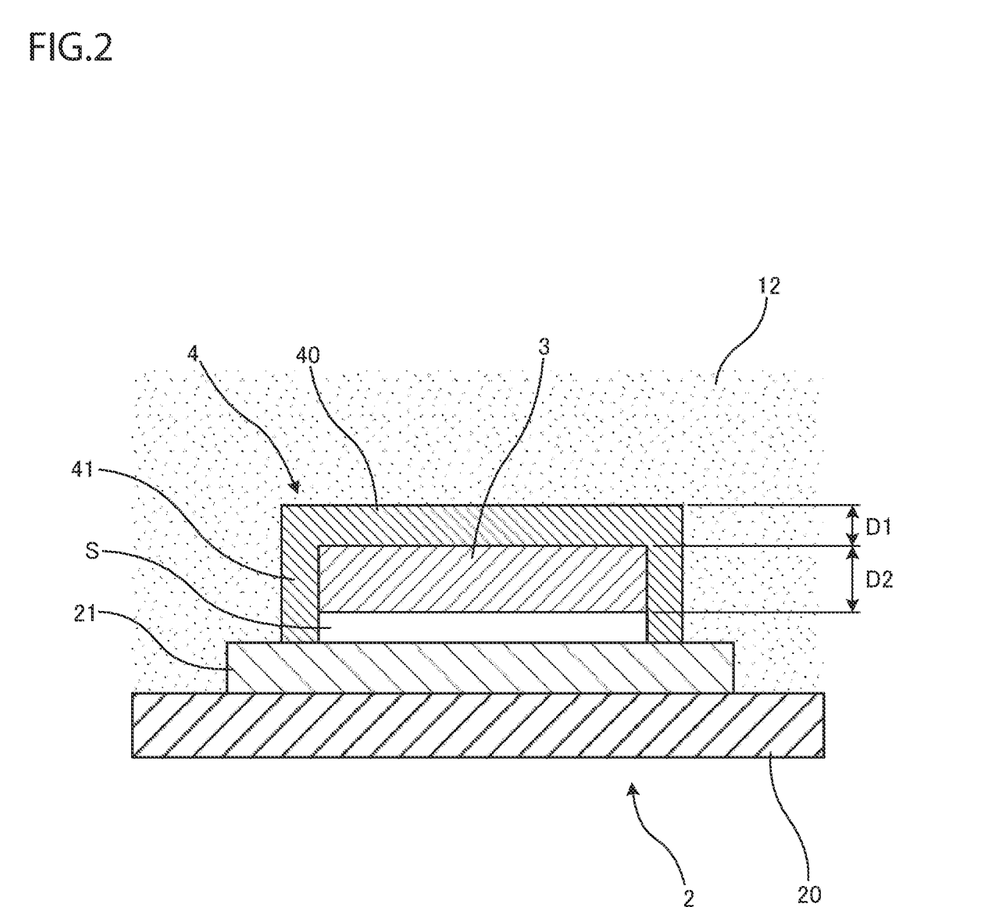
FIG. 2 is a partially enlarged view of a part around a semiconductor element in FIG. 1.

A semiconductor module to which the present invention is applicable is described below. FIG. 1 is a cross-section view showing a semiconductor module according to an embodiment. FIG. 2 is a partially enlarged view of a part around a semiconductor element in FIG. 1. The semiconductor module, which is described below, is merely an example, and changes can be made as appropriate without limiting thereto.

In the following drawings, a longitudinal direction, a shorter direction and a height direction of the semiconductor module are defined as an X direction, a Y direction and a Z direction, respectively. In some cases, the X direction, the Y direction and the Z direction may be called a front-back direction, a right-left direction and an up-down direction, respectively. These directions (front-back, right-left, and up-down directions) are words used for convenience of description, and the correspondence relationships among the X, Y, Z directions may change in accordance with the attached attitude of the semiconductor module. The planar view herein refers to a view in the Z-axis positive direction of an upper surface of the semiconductor module.

A semiconductor module 1 is applied to a power converter such as a power module. As shown in FIG. 1, the semiconductor module 1 includes a base plate 10, a laminate substrate 2 disposed on the base plate 10, a semiconductor element 3 mounted on the laminate substrate 2 through a bonding material S, a wiring member W that is a wiring member to be electrically connected to the semiconductor element 3, a case member 11 that accommodates the laminate substrate 2, the semiconductor element 3 and the wiring member W, and a sealing resin 12 filled in an internal space of the case member 11.

The base plate 10 is a metallic plate having a square shape in planar view and being made of, for example, copper, aluminum or an alloy thereof and operates as a heat dissipation plate that dissipates heat from the laminate substrate 2 and electronic parts mounted thereon, to outside.

The case member 11 is a frame body made of a resin and having a rectangular frame shape following an external shape of the base plate 10 and, for example, is bonded onto the base plate 10 with an adhesive or the like. A lid, not shown, may be provided above the case member 11. The sealing resin 12 is filled in a space enclosed by the base plate 10 and the case member 11. The base plate 10 and the case member 11 define the space to be filled with the sealing resin 12. The case member 11 is formed of a thermoplastic resin. Examples of such a resin include a polyphenylene sulfide resin (PPS resin), a polybutylene terephthalate resin (PBT resin), a phenol resin and the like. Note that a terminal member, not shown, for external connection is buried in the case member 11.

The sealing resin 12 is filled in the internal space of the case member 11 provided by the frame-shaped case member 11. Thus, the laminate substrate 2 and the semiconductor element 3 and the wiring member W mounted thereon are sealed within the space above. The sealing resin 12 is formed of a thermosetting resin. The sealing resin 12 preferably contains at least one of epoxy, silicone, urethane, polyimide, polyamide, and polyamide-imide. For example, an epoxy resin to which a filler is mixed is preferable from viewpoint of its insulation property, heat resistance property and heat dissipation property. This sealing resin 12 has a coefficient of thermal expansion equal to or higher than 7 ppm/K and equal to or lower than 30 ppm/K and an elasticity coefficient equal to or higher than 4 GPa and equal to or lower than 30 GPa.

Also, a full-mold structure may be provided in which the case member 11 and the sealing resin 12 are integrated. In this case, the case member 11 forms a frame-shaped wall part of the semiconductor module and seals the laminate substrate 2, the semiconductor element 3 and the wiring member W. The semiconductor module 1 has an upper surface and a frame-shaped wall part formed by the case member 11 and the base plate 10 is exposed in a part of a lower surface. Furthermore, the semiconductor module 1 may have a full-mold structure in which the laminate substrate 2, the semiconductor element 3 and the wiring member W are sealed only with the sealing resin 12. This full-mold structure can be formed by, for example, transfer molding. Note that the case member 11 to which the sealing resin 12 is integrated is formed of a thermosetting resin. As such a resin, an epoxy resin to which a filler is mixed is preferably used.

The laminate substrate 2 is formed from, for example, a direct copper bonding (DCB) substrate, an active metal brazing (AMB) substrate or a metallic base substrate. The laminate substrate 2 has an insulating layer 20. The insulating layer 20 is formed by, for example, an insulating material such as a ceramics material such as alumina ($Al_2O_3$), aluminum nitride (AlN) or silicon nitride ($Si_3N_4$), a resin material such as epoxy or liquid crystal polymer, or an epoxy resin material having a ceramics material as a filler.

A plurality of circuit plates 21 and 22 are provided on an upper surface of the insulating layer 20. Although FIG. 1 only shows two of the circuit plates 21 and 22 for convenience, more circuit plates may be provided on the upper surface of the insulating layer 20. These circuit plates are metallic layers of, for example, a copper foil and are formed in island shapes on the insulating layer 20 such that the circuit plates are electrically insulated from each other.

A plurality of semiconductor elements 3 are disposed on an upper surface of the circuit plate 21 through the bonding material S such as solder. The semiconductor elements 3 are square shaped in planar view.

The wiring member W is a wiring member. The wiring member W has one end bonded to upper surface electrodes of the semiconductor elements 3 and the other end bonded to the other circuit plate 22. As a material of the wiring member W, one of or a combination of gold, copper, aluminum, a gold alloy, a copper alloy and an aluminum alloy can be used. A member other than a wire can be used as the wiring member. For example, a ribbon or a lead frame can be used instead of a wire.

The semiconductor elements 3 are disposed on the upper surface of the circuit plate 21 through the bonding material S and are electrically connected thereto. Although FIG. 1 shows one semiconductor element 3 for one circuit plate 21 for convenience, more semiconductor elements 3 may be disposed on the circuit plate 21.

The semiconductor element 3 is formed from a wide-bandgap semiconductor element having a large bandgap. The wide-bandgap semiconductor element may also be called a widegap semiconductor element. The semiconductor element 3 has a square shape (rectangular shape) in planar view formed by a wide-bandgap semiconductor substrate of, for example, silicon carbide (Sic), gallium nitride (GaN) and diamond.

As the semiconductor element 3, a switching element such as an insulated gate bipolar transistor (IGBT) or a power metal oxide semiconductor field effect transistor (MOSFET) or a diode such as a free wheeling diode (FWD) is used. Alternatively, as the semiconductor element 3, a reverse conducting (RC)—IGBT element in which an IGBT and an FWD are integrated, a power MOSFET element, a reverse blocking (RB)—IGBT having a sufficient resistance to pressure against a reverse bias or the like may be used.

The shape, number and position of the semiconductor elements 3 can be changed as appropriate. Although the semiconductor element 3 according to this embodiment is a vertical switching element having a function element such as a transistor on the semiconductor substrate, the semiconductor element 3 is not limited thereto and may be a horizontal switching element.

Electrically driven motor vehicles are emerging in recent years, as typified by a hybrid electric vehicle (HEV) and an electric vehicle (EV) have been available. Assurance of long-term reliability is required for the power semiconductor modules used for power conversion in HEVs and EVs. Furthermore, the service temperature of semiconductor elements is increasing. In this respect, development of semiconductor elements that can operate even at a high temperature has been carried out vigorously, and semiconductor elements having reduced sizes, increased resistance to pressure and increased current densities have been developed.

A wide-bandgap semiconductor of SiC, GaN or the like has a larger bandgap than that of a Si semiconductor. Thus, with such a wide-bandgap semiconductor, semiconductor modules that have reduced size, increased resistance to pressure and increased current densities and that can operate at a higher temperature have been expected. Realization of instrumentation of the semiconductor elements having such features contributing to long-term stability of operations has been demanded.

By the way, in a semiconductor module, due to heat generated while a semiconductor element is operating, thermal stress depending on differences in a coefficient of thermal expansion and elasticity coefficient occurs between the semiconductor element and a sealing resin. The thermal stress is concentrated at an edge part of an outer circumference of an upper surface of the semiconductor element.

For example, a Si semiconductor has a coefficient of thermal expansion of 2 to 3 ppm/K and an elasticity coefficient of 110 to 140 Gpa. On the other hand, a SiC semiconductor has a coefficient of thermal expansion of 3 to 5 ppm/K and an elasticity coefficient of 400 to 500 Gpa. A GaN semiconductor has a coefficient of thermal expansion of 3 to 6 ppm/K and an elasticity coefficient of 120 to 300 Gpa.

In this way, a wide-bandgap semiconductor element such as a SiC semiconductor element or a GaN semiconductor element produced by using SiC or GaN has an elasticity coefficient higher than a Si semiconductor element produced by using Si. Because of this, it is concerned in the wide-bandgap semiconductor element that, due to the thermal stress concentrated at an edge part of an outer circumference of an upper surface of the wide-bandgap semiconductor element, peeling occurs at an adhesive interface between the edge part and a sealing resin. Also, occurrence of cracking in the sealing resin starting from a part near the edge part is concerned.

Figure 3:
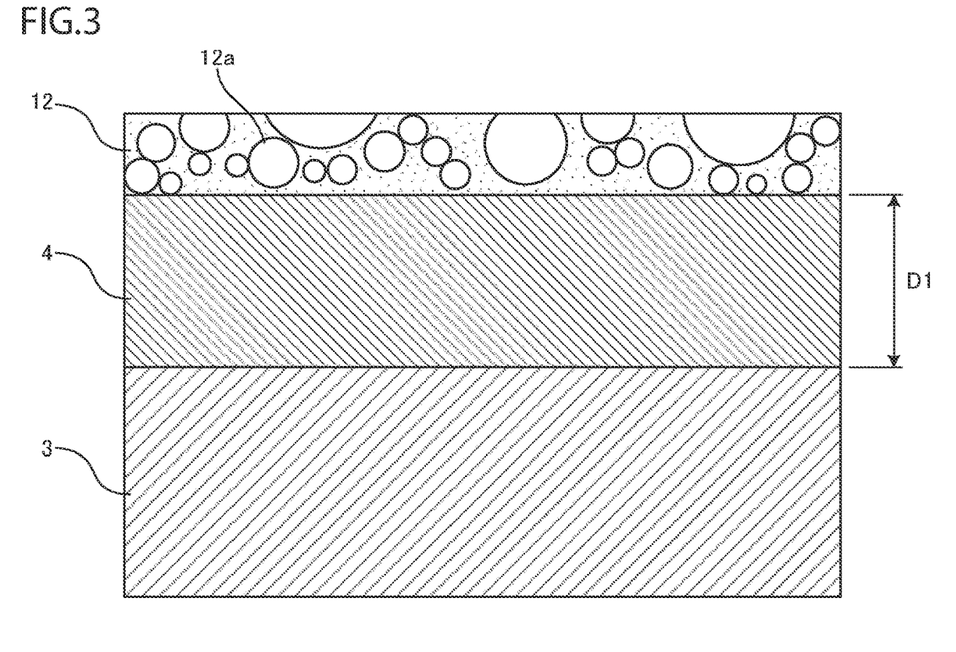
FIG. 3 is an enlarged view in the vicinity of a buffer member in the semiconductor module according to the embodiment.
Figure 4:
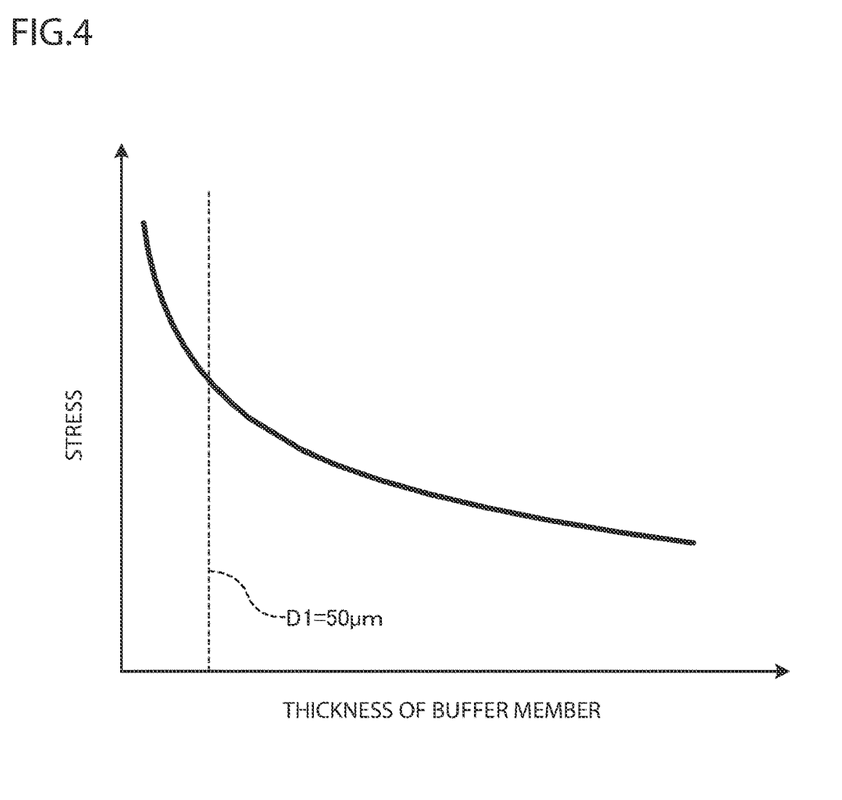
FIG. 4 is a graph showing a relationship between thickness of the buffer member and stress.

Accordingly, the present inventor has reached the present invention with focus on suppression of occurrence of peeling and cracking in a resin at an edge part of a semiconductor element. Hereinafter, a surface structure of a semiconductor element according to an embodiment is described with reference to FIG. 3 and FIG. 4. FIG. 3 is an enlarged view in the vicinity of a buffer member in a semiconductor module according to the embodiment. FIG. 4 is a graph showing a relationship between thickness of the buffer member and stress. FIG. 4 has a horizontal axis indicating thickness of the buffer member and a vertical axis indicating shearing stress (for example, a maximum shearing stress at an interface between the semiconductor element and the buffer member).

More specifically, according to this embodiment, as shown in FIG. 3, an upper part of the semiconductor element 3 formed from a wide-bandgap semiconductor is covered by a buffer member 4 having a predetermined thickness D1. The buffer member 4 covers at least an edge part of an outer circumference of an upper surface of the semiconductor element 3. Also, the semiconductor element 3 and the buffer member 4 are covered by the sealing resin 12.

The semiconductor element 3 has a rectangular shape in planar view, and the buffer member 4 covers at least four corners of the upper surface of the semiconductor element 3. More specifically, the buffer member 4 includes an upper surface portion 40 that covers the entire upper surface of the semiconductor element 3 and a side surface portion 41 that covers a side surface of the semiconductor element 3 and the bonding material S.

The upper surface portion 40 has a rectangular shape in planar view and covers the entire circumference of the edge part of the upper surface of the semiconductor element 3. The side surface portion 41 has a square cylindrical shape projecting downward from the outer circumferential end of the upper surface portion 40. The side surface portion 41 covers a side surface of the semiconductor element 3 and the bonding material S. In other words, the lower end of the side surface portion 41 is in contact with the upper surface of the circuit plate 21.

The thickness D1 of the upper surface portion 40 is preferably equal to or larger than 50 μm, details of which are described later. Also, the buffer member 4 preferably mainly contains at least one of polyimide, polyamide and polyamide-imide. Furthermore, the buffer member 4 preferably has an elasticity coefficient equal to or lower than 3 Gpa. In other words, the elasticity coefficient of the buffer member 4 is preferably lower than the elasticity coefficient of the sealing resin 12.

Also, the buffer member 4 may be a cured film formed by curing a liquid resin applied to the semiconductor element. The buffer member 4 may be formed from, for example, a thermosetting resin. Also, the buffer member 4 formed in advance to be sheet-like may be pasted to the upper surface of the semiconductor element 3, details of which are described later.

According to this embodiment, as described above, the thickness D1 of the buffer member 4 is preferably equal to or larger than 50 μm. As shown in FIG. 4, the shearing stress at the interface between the semiconductor element 3 and the buffer member 4 rapidly decreases in the vicinity of D1=50 μm and gently decreases after 50 μm. In other words, by setting the thickness D1 of the buffer member 4 to 50 μm where the shearing stress starts rapidly decreasing, a stress suppression effect can be exerted. Thus, occurrence of peeling and cracking in the vicinity of the interface between the semiconductor element 3 and the buffer member 4 and the sealing resin 12 can be suppressed. Note that, in this case, the semiconductor element 3 preferably has a thickness D2 of 100 μm to 500 μm.

Also, as described above, the buffer member 4 is formed by using a material having an elasticity coefficient lower than that of the sealing resin 12. The elasticity coefficient of the buffer member 4 is also lower than the elasticity coefficient of the semiconductor element 3. Preferably, the buffer member 4 has an elasticity coefficient equal to or higher than $0.5 \times 10^{-3}$ GPa and equal to or lower than 3 GPa. When the buffer member 4 has an excessively lower elasticity coefficient, it is difficult for the buffer member 4 to hold its shape. On the other hand, when the buffer member 4 has an excessively higher elasticity coefficient, the stress relaxation effect becomes lower, and occurrence of cracking cannot be suppressed. The thermal stress due to a difference in volume change caused by heat between the semiconductor element 3 and the sealing resin 12 is relaxed when the buffer member 4 being a member having a low elasticity coefficient elastically deforms between the semiconductor element 3 and the sealing resin 12. Because of this relaxation effect, the thermal stress caused near the edge part of the outer circumference of the upper surface of the semiconductor element 3 becomes small, and occurrence of peeling at the adhesive interface between the edge part and the sealing resin 12 and cracking of the sealing resin 12 starting from a part near the edge part are suppressed.

Also, the buffer member 4 may be formed by using a material having a high breaking elongation such that the buffer member 4 is not broken when it elastically deforms in accordance with the difference in volume change due to heat between the semiconductor element 3 and the sealing resin 12. As an example, the breaking elongation of the buffer member 4 is preferably equal to or higher than 40%.

Also, as shown in FIG. 3, when a filler 12*a* is added to the sealing resin 12, the boundary between the buffer member 4 and the sealing resin 12 becomes clearer in its cross-section.

Next, with reference to FIG. 1 and FIG. 5, a manufacturing method for the semiconductor module according to this embodiment is described. FIGS. 5A to 5D schematically show a semiconductor module manufacturing method. The semiconductor module manufacturing method, which is described below, is merely an example and can be changed as appropriate without limiting to the configuration. Also, the order of steps included in the semiconductor module manufacturing method can be changed as appropriate as long as no contradiction arises. The semiconductor module manufacturing method may include a step other than the steps described below.

As shown in FIG. 1 and FIG. 5, the manufacturing method for the semiconductor module 1 includes a case member disposing step (see FIG. 5A), a chip disposing step (see FIG. 5B), a wiring step (see FIG. 5C), a buffer member disposing step (see FIG. 5D), and a sealing step (see FIG. 1), which are to be performed in this order.

Figure 5A:
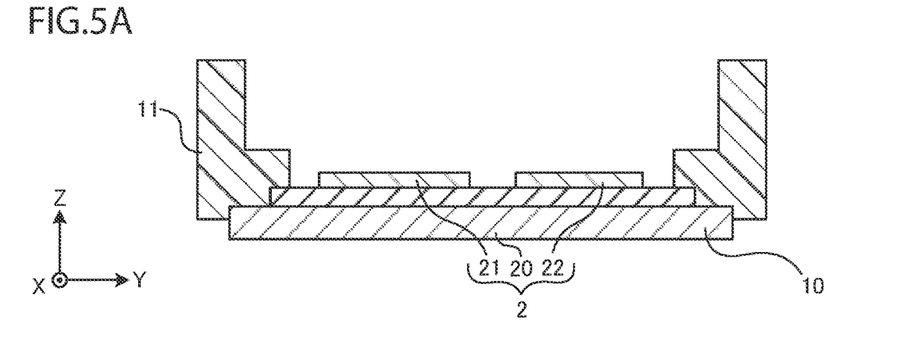
FIGS. 5A to 5D are schematic diagrams showing a manufacturing method for the semiconductor module according to the embodiment.

First, the case member disposing step is performed. As shown in FIG. 5A, the laminate substrate 2 is disposed in advance on the upper surface of the base plate 10. In the case member disposing step, the frame-shaped case member 11 is disposed so as to enclose the outer circumference of the laminate substrate 2. The case member 11 is disposed on outer circumferential ends of the base plate 10 and the laminate substrate 2 through an adhesive, not shown.

Figure 5B:
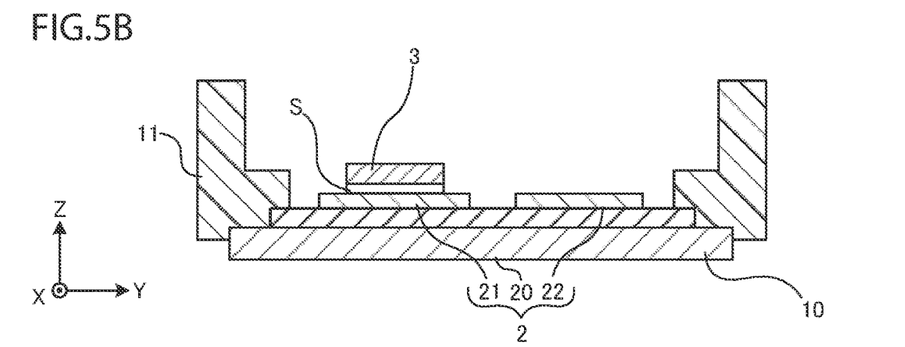

Next, the chip disposing step is performed. As shown in FIG. 5B, in the chip disposing step, the semiconductor element 3 is disposed on the upper surface of the circuit plate 21 through the bonding material S such as solder. The bonding material S is not limited to solder, and a sintered material can be used.

Figure 5C:
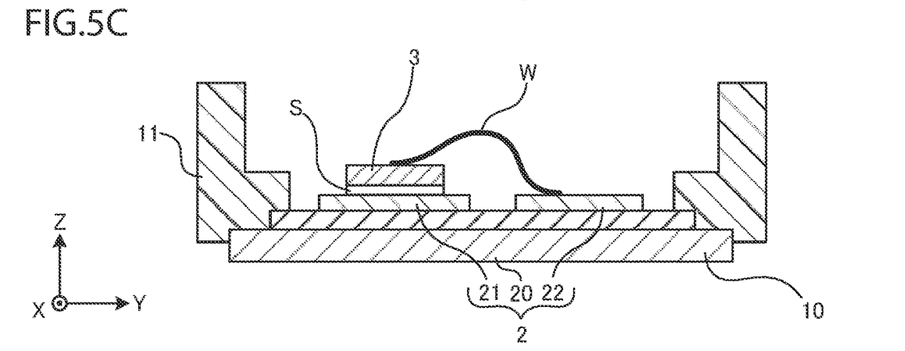

Next, the wiring step is performed. As shown in FIG. 5C, in the wiring step, the upper surface electrode of the semiconductor element 3 and the other circuit plate 22 are electrically connected via the wiring member W. The wiring member W is connected by, for example, wire bonding.

Figure 5D:
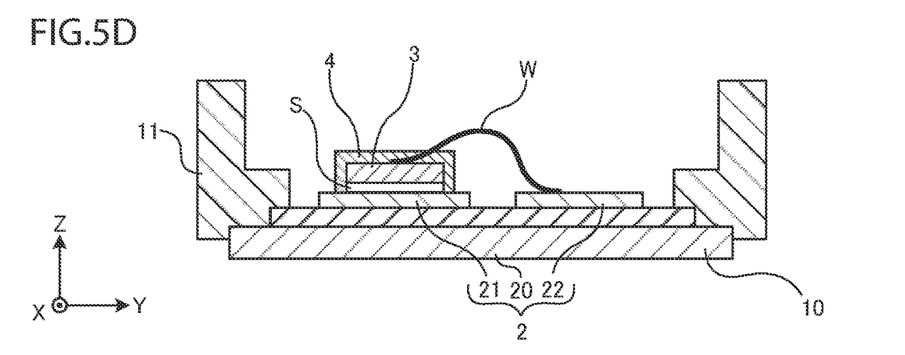

After the wiring step, the buffer member disposing step is performed. As shown in FIG. 5D, in the buffer member disposing step, the buffer member is disposed at least at the edge part of the outer circumference of the upper surface of the semiconductor element 3. Referring to FIG. 5D, a liquid resin is applied to the upper surface of the semiconductor element 3 and is evened out such that the semiconductor element 3 and the side surface of the bonding material S are covered with the applied liquid resin. In this case, the liquid resin preferably has a viscosity equal to or higher than 50 Pa's. The liquid resin is heated to be cured (heat curing), and the buffer member 4 is thus formed. By using a liquid resin for the buffer member 4, the upper part of the semiconductor element 3 can be covered entirely with the liquid resin independently of the surface shape of the semiconductor element 3. In this case, the thickness of the buffer member 4 on the upper surface of the semiconductor element 3 is preferably equal to or larger than 50 μm.

Next, the sealing step is performed. As shown in FIG. 1, in the sealing step, the sealing resin 12 is filled into a space enclosed by the case member 11. The sealing resin 12 is formed by curing a liquid resin at a predetermined temperature. As a result, the semiconductor element 3, the buffer member 4 and the wiring member W are covered (sealed) with the sealing resin. In this way, the semiconductor module 1 is manufactured.

As described above, according to this embodiment, the buffer member 4 is disposed so as to cover the edge part of the outer circumference of the upper surface of the semiconductor element 3 formed from a wide-bandgap semiconductor, and the thickness of the buffer member 4 is equal to or larger than 50 μm. Thus, the thermal stress occurring near the edge part of the outer circumference of the upper surface of the semiconductor element 3 becomes small, and occurrence of peeling at the adhesive interface between the edge part and the buffer member 4 and the sealing resin 12 and cracking of the sealing resin 12 starting from a part near the edge part is suppressed.

Figure 6:
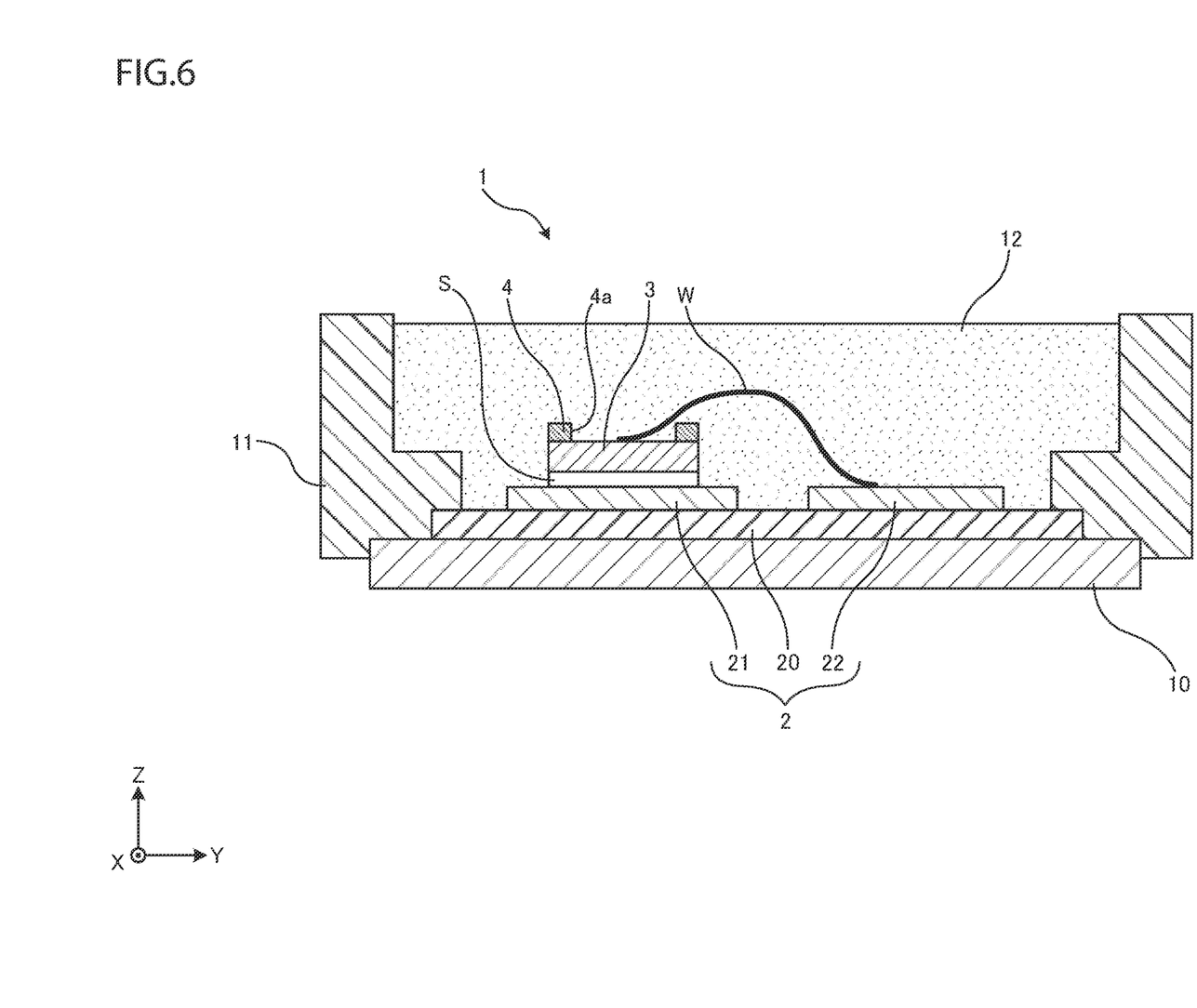
FIG. 6 is a cross-section view showing a semiconductor module according to a modification example.
Figure 7A:
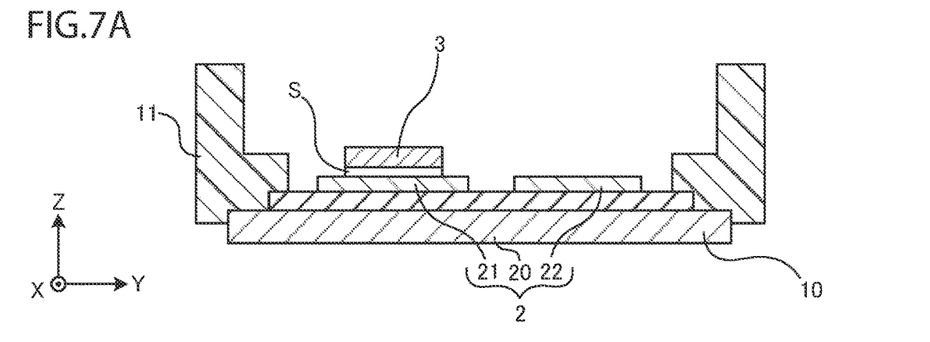
FIGS. 7A to 7D are schematic diagrams showing a manufacturing method for the semiconductor module according to the modification example.
Figure 7B:
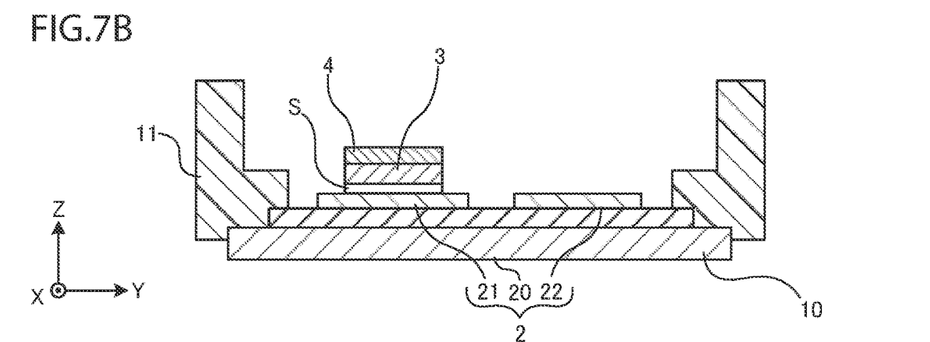
Figure 7C:
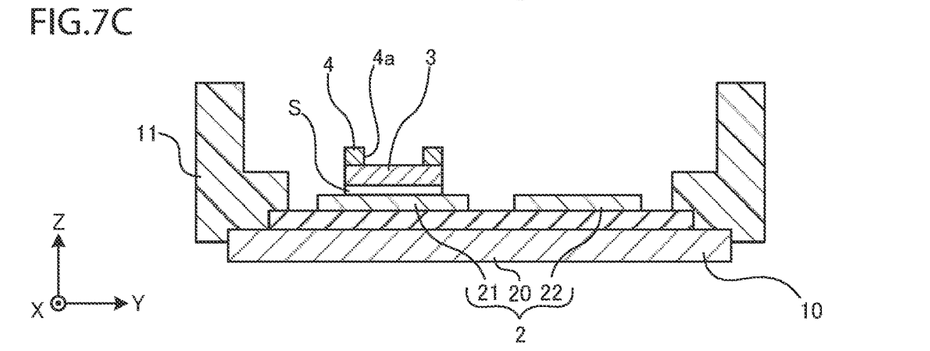
Figure 7D:
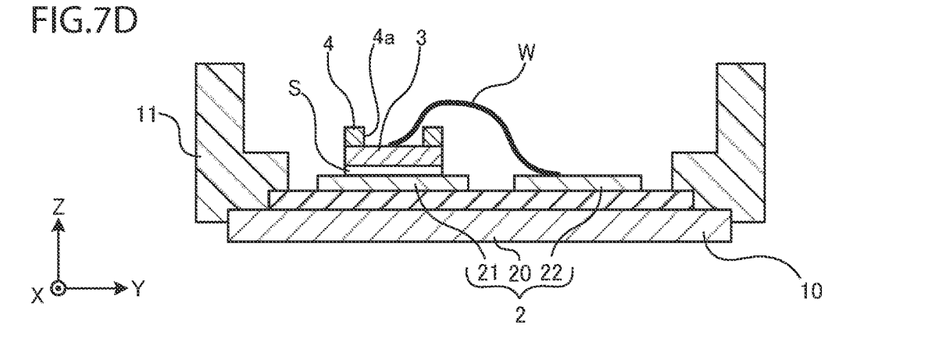
Figure 8A:
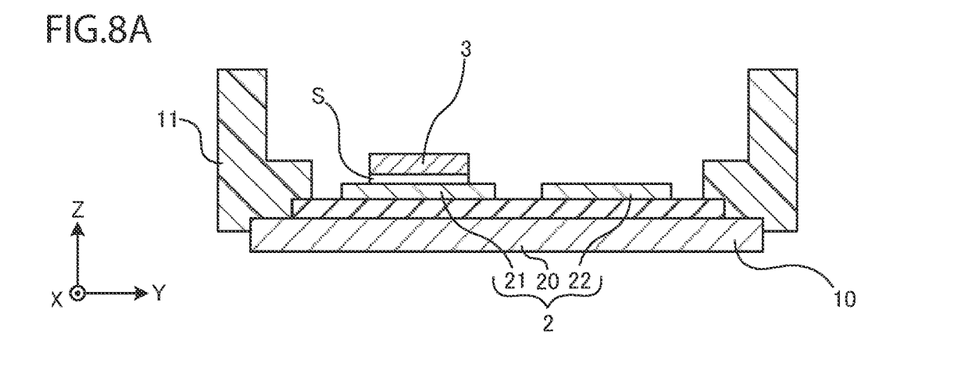
FIGS. 8A to 8C are schematic diagrams showing a manufacturing method for a semiconductor module according to another modification example.
Figure 8B:
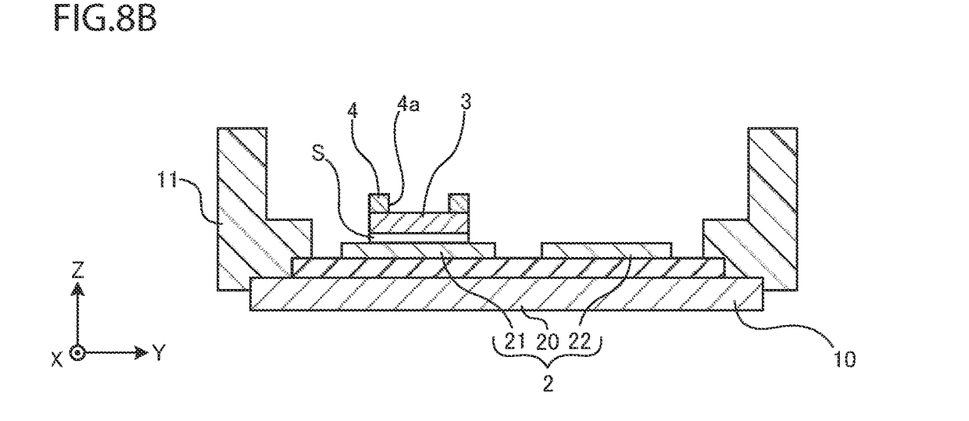
Figure 8C:
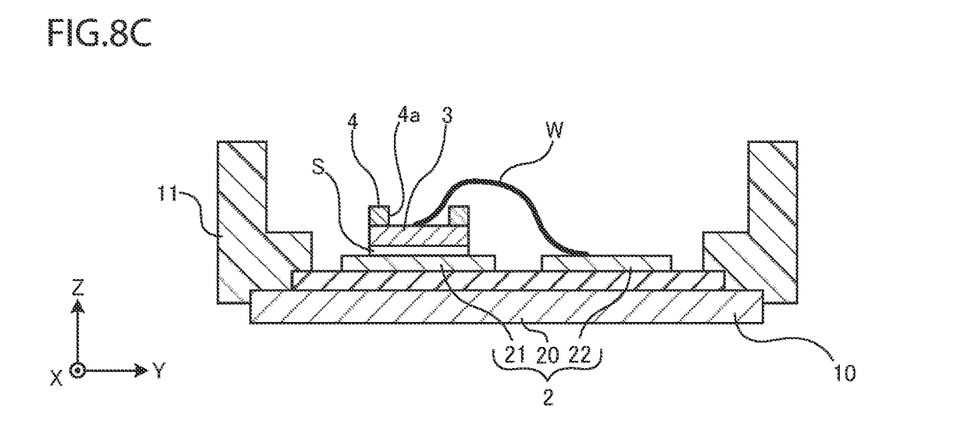

Next, with reference to FIG. 6 and FIG. 8, modification examples are described. FIG. 6 is a cross-section view showing a semiconductor module according to a modification example. FIG. 7 (FIGS. 7A to 7D) is a schematic diagram showing a manufacturing method for the semiconductor module according to the modification example. FIG. 8 (FIGS. 8A to 8C) is a schematic diagram showing a manufacturing method for a semiconductor module according to another modification example. In the following modification examples, the method for forming the buffer member only differs. Therefore, only differences are mainly described, and common numbers refer to common parts, and repetitive description is omitted as appropriate.

Having described the case where, according to the embodiment above, the buffer member 4 is formed by applying a liquid resin to the upper surface of the semiconductor element 3 and then curing it, the present invention is not limited to this configuration. For example, as shown in FIG. 6 and FIG. 7, a sheet-like buffer member 4 formed in advance to have a predetermined shape is pasted (disposed) onto the upper surface of the semiconductor element 3.

As shown in FIG. 6, the buffer member 4 according to the modification example has a rectangular frame shape in planar view having an opening part 4*a* at its center such that the edge part of the outer circumference of the upper surface of the semiconductor element 3 is covered. The inner part of the buffer member 4 defines the opening part 4*a*. The opening part 4*a* is provided at the center in order to obtain a connection part between the wiring member W and the upper surface electrode of the semiconductor element 3. In this case, the thickness of the buffer member 4 is preferably equal to or larger than 50 μm. Because the buffer member 4 is sheet-like, the thickness of the buffer member 4 can be uniformly controlled.

The manufacturing method for the semiconductor module 1 shown in FIG. 6 includes a chip disposing step (see FIG. 7A), a buffer member disposing step (see FIG. 7B), an opening part forming step (see FIG. 7C), a wiring step (see FIG. 7D), and a sealing step (see FIG. 6), which are to be performed in this order.

First, the chip disposing step is performed. As shown in FIG. 7A, the laminate substrate 2 and the case member 11 are disposed in advance on the upper surface of the base plate 10. In the chip disposing step, the semiconductor element 3 is disposed on the upper surface of the circuit plate 21 through the bonding material S such as solder.

Next, the buffer member disposing step is performed. As shown in FIG. 7B, in the buffer member disposing step, a sheet-like buffer member 4 is disposed on the upper surface of the semiconductor element 3. The sheet-like buffer member 4 is cut to a rectangular shape in advance in accordance with the shape of the semiconductor element 3. The sheet-like buffer member 4 is pasted onto the upper surface of the semiconductor element 3 through, for example, an adhesive, not shown. Also, the sheet-like buffer member 4 may have an adhesive layer having a predetermined thickness on its lower surface side (surface facing the upper surface electrode of the semiconductor element). For example, the sheet-like buffer member 4 having an adhesive layer of silicone on a base of polyimide is preferable from viewpoint of heat resistance. Also, as the buffer member 4, a polyimide sheet may be laminated to the semiconductor element 3.

Next, the opening part forming step is performed. As shown in FIG. 7C, in the opening part forming step, the opening part 4a from which the upper surface electrode of the semiconductor element 3 is exposed is formed in the upper surface of the buffer member 4. The opening part 4a may be formed by, for example, etching. Also, the opening part 4a may be formed by laser machining. By performing laser machining, the step can be simplified, and the number of man-hours can be reduced. In this way, by forming the opening part 4a, the rectangular-frame-shaped buffer member 4 is formed which covers the edge part of the outer circumference of the upper surface of the semiconductor element 3. Note that the sheet-like buffer member 4 in which the opening part 4a is provided in advance may be used in the steps in FIGS. 7B and 7C.

Next, the wiring step is performed. As shown in FIG. 7D, in the wiring step, one end of the wiring member W is electrically connected to the upper surface electrode of the semiconductor element 3 exposed from the opening part 4a. The other end of the wiring member W is electrically connected to the upper surface of the circuit plate 22.

Then, the sealing step is performed. As shown in FIG. 6, in the sealing step, the sealing resin 12 is filled into the space enclosed by the case member 11. The sealing resin 12 is formed by curing a liquid resin at a predetermined temperature. As a result, the semiconductor element 3, the buffer member 4 and the wiring member W are covered (sealed) with the sealing resin. Here, the sealing resin 12 is also filled within the opening part 4a. In other words, the sealing resin 12 and the center of the upper surface electrode of the semiconductor element are directly in contact. Also by applying this method, the semiconductor module 1 can be manufactured.

Having described the case where, according to the modification example above, the opening part 4a is formed after the rectangular-shaped buffer member 4 is disposed on the upper surface of the semiconductor element 3, the present invention is not limited to this configuration. For example, a method shown in FIG. 8 may be applied. The manufacturing method for the semiconductor module 1 shown in FIG. 8 includes a chip disposing step (see FIG. 8A), a buffer member disposing step (see FIG. 8B), a wiring step (see FIG. 8C), and a sealing step (see FIG. 6), which are to be performed in this order. Note that, since the chip disposing step, wiring step and sealing step are the same as those in FIGS. 6 and 7, the description is omitted.

As shown in FIG. 8B, in the buffer member disposing step, the buffer member 4 formed in advance to have a rectangular frame shape along an outer circumferential edge of the semiconductor element 3 is disposed on the semiconductor element 3. Because the opening part 4a is formed in advance at the center, the opening part forming step described above can be omitted, and the number of man-hours can be reduced. Also by applying this method, the semiconductor module 1 can be manufactured.

Figure 9:
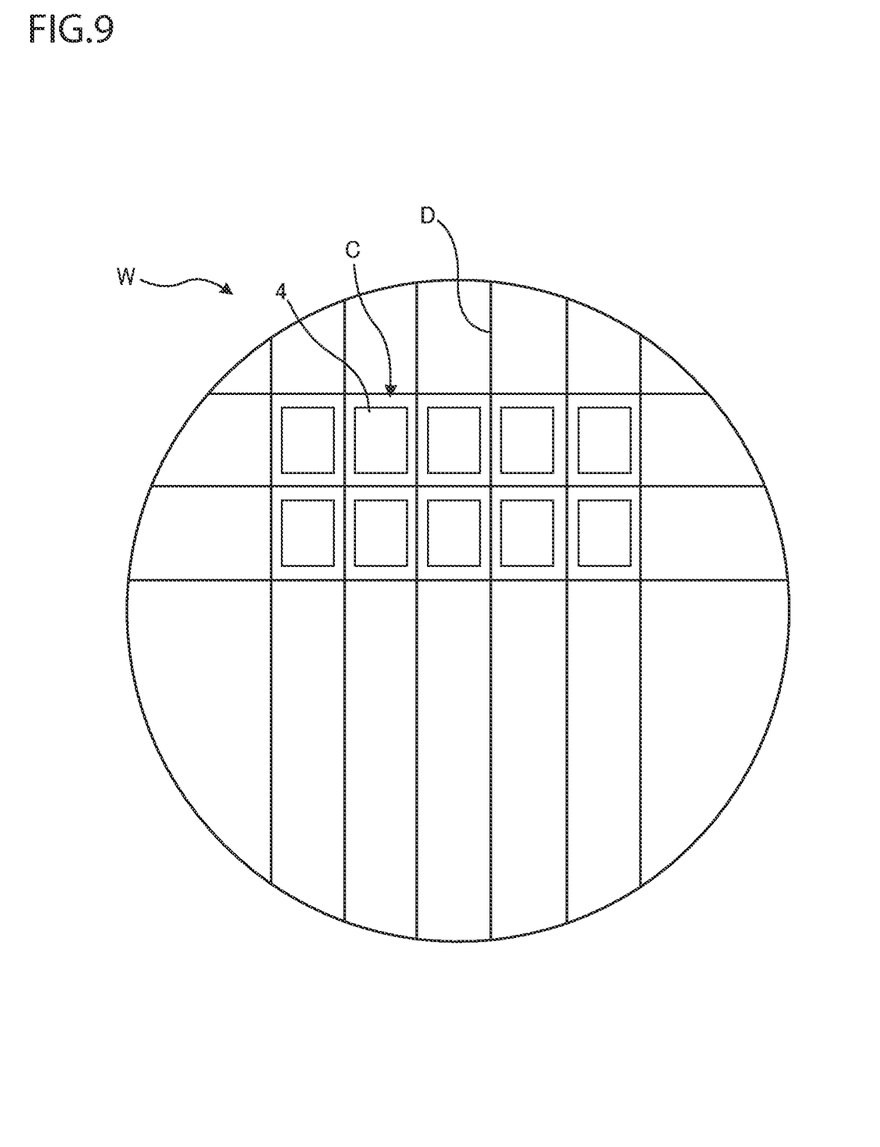
FIG. 9 is a schematic diagram showing a manufacturing method for a semiconductor module according to another modification example.

Note that, having described the case where, according to the embodiment above, the buffer member 4 is disposed after the semiconductor elements 3 divided into individual chips are disposed on the upper surface of the circuit plate 21, the present invention is not limited to this configuration. For example, as shown in FIG. 9, after the buffer member 4 is pasted directly onto one wafer W having a plurality of devices (semiconductor elements 3) thereon, the wafer W and the buffer member 4 may be divided into individual chips C along dicing lines D. Because the buffer member 4 can be disposed on the plurality of semiconductor elements 3 by one operation, it is efficient. Also, having described, as an example, the continuous frame-shaped buffer member 4 according to the embodiment above, the present invention is not limited thereto, and various changes can be made as appropriate. The buffer member 4 is only required to cover at least four corners of the semiconductor element 3 and, for example, may have an intermittent shape.

Having described the embodiment and modification examples, all or some of the embodiment and the modification examples may be combined.

Embodiments are not limited to the aforementioned embodiment and modification examples, and various changes, replacements and modifications can be made thereto without departing from the spirit and scope of the technical idea. Furthermore, if the technical idea can be realized by a different method with an advance of the technology or a different technology derived therefrom, the technical idea can be implemented by using the method. Therefore, the claims cover all embodiments that can be included within the scope of the technical idea.

Characteristic points according to the aforementioned embodiment are organized below.

A semiconductor module according to the aforementioned embodiment includes a semiconductor element formed from a wide-bandgap semiconductor, a buffer member that covers an edge part of an outer circumference of an upper surface of the semiconductor element, and a sealing resin that covers the semiconductor element and the buffer member. The buffer member has a thickness equal to or larger than 50 μm.

In the semiconductor module according to the aforementioned embodiment, the semiconductor element has a rectangular shape in planar view, and the buffer member covers at least four corners of the upper surface of the semiconductor element.

In the semiconductor module according to the aforementioned embodiment, the semiconductor element is produced by using one of silicon carbide (Sic), gallium nitride (GaN) and diamond.

In the semiconductor module according to the aforementioned embodiment, the buffer member mainly contains at least one of polyimide, polyamide and polyamide-imide.

In the semiconductor module according to the aforementioned embodiment, the buffer member has an elasticity coefficient lower than an elasticity coefficient of the sealing resin.

In the semiconductor module according to the aforementioned embodiment, the buffer member covers an entire circumference of the edge part of the semiconductor element.

In the semiconductor module according to the aforementioned embodiment, the buffer member has an elasticity coefficient equal to or higher than $0.5 \times 10^{-3}$ GPa and equal to or lower than 3 GPa.

In the semiconductor module according to the aforementioned embodiment, the sealing resin contains at least one of epoxy, silicone, urethane, polyimide, polyamide, and polyamide-imide.

In the semiconductor module according to the aforementioned embodiment, the sealing resin is an epoxy resin to which a filler is added.

In the semiconductor module according to the aforementioned embodiment, the sealing resin has an elasticity coefficient equal to or higher than 4 GPa and equal to or lower than 30 GPa.

In the semiconductor module according to the aforementioned embodiment, the buffer member is sheet-like.

In the semiconductor module according to the aforementioned embodiment, the buffer member is a cured film formed by curing a liquid resin applied to the semiconductor element.

A semiconductor module manufacturing method according to the aforementioned embodiment includes a buffer member disposing step of disposing a buffer member at least at an edge part of an outer circumference of an upper surface of a semiconductor element formed from a wide-bandgap semiconductor, an opening part forming step of forming an opening part from which an upper surface electrode of the semiconductor element is exposed in an upper surface of the buffer member, and a wiring step of connecting a wiring member to the upper surface electrode. The buffer member has a thickness equal to or larger than 50 μm.

A semiconductor module manufacturing method according to the aforementioned embodiment includes a wiring step of connecting a wiring member to an upper surface electrode of a semiconductor element formed from a wide-bandgap semiconductor, and a buffer member disposing step of disposing a buffer member at least at an edge part of an outer circumference of an upper surface of the semiconductor element after the wiring step. The buffer member has a thickness equal to or larger than 50 μm.

A semiconductor module manufacturing method according to the aforementioned embodiment includes a buffer member disposing step of disposing a buffer member covering an edge part of an outer circumference of an upper surface of a semiconductor element formed from a wide-bandgap semiconductor and having an opening part from which an upper surface electrode of the semiconductor element is exposed, and a wiring step of connecting a wiring member to the upper surface electrode. The buffer member has a thickness equal to or larger than 50 μm.

In the semiconductor module manufacturing method according to the aforementioned embodiment, in the buffer member disposing step, the buffer member is formed by applying a liquid resin and then curing the liquid resin.

In the semiconductor module manufacturing method according to the aforementioned embodiment, in the buffer member disposing step, a sheet-like buffer member formed in advance to have a predetermined shape is disposed.

The semiconductor module manufacturing method according to the aforementioned embodiment further includes a sealing step of covering the semiconductor element, the buffer member and the wiring member with a sealing resin.

In the semiconductor module manufacturing method according to the aforementioned embodiment, in the opening part forming step, the opening part is formed by laser machining.

INDUSTRIAL APPLICABILITY

As described above, the present invention has an effect that stress concentration near an edge part of an outer circumference of an upper surface of a wide-bandgap semiconductor element can be suppressed, and is particularly usable for a semiconductor module and a semiconductor module manufacturing method.

REFERENCE SIGNS LIST

1: semiconductor module
2: laminate substrate
3: semiconductor element
4: buffer member
4a: opening part
10: base plate
11: case member
12: sealing resin
12a: filler
20: insulating layer
21: circuit plate
22: circuit plate
40: upper surface portion
41: side surface portion
D1: thickness of buffer member
D2: thickness of semiconductor element
S: bonding material
W: wiring member

What is claimed is:
1. A semiconductor module, comprising:
a semiconductor element made of a wide-bandgap semiconductor, the semiconductor element having an upper surface with an edge;
a buffer member that covers said edge; and
a sealing resin that seals the semiconductor element and the buffer member, wherein
the buffer member has a thickness equal to or larger than 50 mm,
the buffer member has an elasticity coefficient lower than an elasticity coefficient of the sealing resin, and
the buffer member directly covers the upper surface of the semiconductor element entirely.
2. The semiconductor module according to claim 1, wherein
the semiconductor element has a rectangular shape in a plan view of the semiconductor module and has edges at four corners of the upper surface, and the buffer member covers at least the four corners of the upper surface of the semiconductor element.

3. The semiconductor module according to claim 1, wherein the semiconductor element is made of one of silicon carbide (SiC), gallium nitride (GaN) or diamond.

4. The semiconductor module according to claim 1, wherein the buffer member contains at least one of polyimide, polyamide or polyamide-imide as a main component.

5. The semiconductor module according to claim 1, wherein the buffer member covers an entire circumference at the upper surface including the edge of the semiconductor element.

6. The semiconductor module according to claim 1, wherein the buffer member has an elasticity coefficient in a range of $0.5'10^{-3}$ GPa to 3 GPa.

7. The semiconductor module according to claim 1, wherein the sealing resin contains at least one of epoxy, silicone, urethane, polyimide, polyamide, or polyamide-imide.

8. The semiconductor module according to claim 1, wherein the sealing resin is an epoxy resin to which a filler is added.

9. The semiconductor module according to claim 1, wherein the sealing resin has an elasticity coefficient in a range of 4 GPa to 30 GPa.

10. The semiconductor module according to claim 1, wherein the buffer member has a constant thickness.

11. The semiconductor module according to claim 1, wherein the buffer member is a cured film formed by curing a liquid resin applied to the semiconductor element.

12. A semiconductor module, comprising:
a semiconductor element made of a wide-bandgap semiconductor, the semiconductor element having an upper surface with an edge;
a buffer member that covers said edge; and
a sealing resin that seals the semiconductor element and the buffer member,
a circuit board; and
a bonding material bonding to the circuit board to the semiconductor element, wherein
the buffer member has a thickness equal to or larger than 50 mm,
the buffer member has an elasticity coefficient lower than an elasticity coefficient of the sealing resin, and
the buffer member entirely covers the semiconductor element and the bonding material so that the sealing resin is free of contact with the semiconductor element and the bonding material.

13. The semiconductor module according to claim 1, wherein the buffer member directly contacts outermost side surfaces of the semiconductor element.

14. The semiconductor module according to claim 1, wherein the buffer member covers only the upper surface of the semiconductor element.

15. A semiconductor module, comprising:
a semiconductor element made of a wide-bandgap semiconductor, the semiconductor element having an upper surface with an edge;
a buffer member that covers said edge; and
a sealing resin that seals the semiconductor element and the buffer member, wherein
the buffer member has a thickness equal to or larger than 50 mm,
the buffer member has an elasticity coefficient lower than an elasticity coefficient of the sealing resin, and
the buffer member directly covers the upper surface of the semiconductor element partially such that an opening area at center of the upper surface is exposed from the buffer member and only an outer peripheral region including the edge is covered.

16. The semiconductor module according to claim 15, wherein the buffer member directly contacts outermost side surfaces of the semiconductor element.

17. The semiconductor module according to claim 15, wherein the buffer member covers only the upper surface of the semiconductor element.

* * * * *